(12) United States Patent
Seki et al.

(10) Patent No.: US 10,720,602 B2
(45) Date of Patent: Jul. 21, 2020

(54) DISPLAY UNIT

(71) Applicant: JOLED INC., Tokyo (JP)

(72) Inventors: Takahiro Seki, Tokyo (JP); Kanta Judai, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/234,565

(22) Filed: Dec. 28, 2018

(65) Prior Publication Data

US 2019/0221770 A1    Jul. 18, 2019

(30) Foreign Application Priority Data

Jan. 12, 2018  (JP) ................................ 2018-003172

(51) Int. Cl.
*H01L 51/52* (2006.01)
*H01L 51/00* (2006.01)

(52) U.S. Cl.
CPC ...... *H01L 51/5253* (2013.01); *H01L 51/0097* (2013.01); *H01L 51/5281* (2013.01); *H01L 2251/5338* (2013.01)

(58) Field of Classification Search
CPC ............. H01L 51/5253; H01L 51/0097; H01L 51/528
See application file for complete search history.

(56) References Cited

U.S. PATENT DOCUMENTS

2003/0062519 A1    4/2003  Yamazaki et al.
2009/0066888 A1*   3/2009  Kunai ................... G02B 5/305
                                                          349/96
2016/0293895 A1*  10/2016  Kim ....................... H01L 51/525

FOREIGN PATENT DOCUMENTS

JP            2003-115388 A     4/2003

* cited by examiner

*Primary Examiner* — Dale E Page
*Assistant Examiner* — Quovaunda Jefferson
(74) *Attorney, Agent, or Firm* — Hauptman Ham, LLP (57) ABSTRACT

A display unit includes a flexible substrate, a display device layer, a polarizer, a first moisture barrier film, and a second moisture barrier film. The display device layer is provided on the flexible substrate. The polarizer is provided over the flexible substrate with the display device layer being interposed between the flexible substrate and the polarizer and has a first surface opposed to the flexible substrate, a second surface facing the first surface, and an end surface connecting the first surface and the second surface. The first moisture barrier film covers the first surface of the polarizer. The second moisture barrier film covers the second surface and the end surface of the polarizer, and is in contact with the first moisture barrier film.

13 Claims, 8 Drawing Sheets

DISPLAY UNIT

CROSS REFERENCE TO RELATED APPLICATIONS

This application claims the benefit of Japanese Priority Patent Application No. 2018-003172 filed on Jan. 12, 2018, the entire contents of which are incorporated herein by reference.

BACKGROUND

The technology relates to a display unit including a flexible substrate.

A display unit that includes a flexible substrate, such as a plastic or resin substrate, has been proposed in Japanese Unexamined Patent Application Publication (JP-A) No. 2003-115388, for example. The display unit disclosed in JP-A 2003-115388 includes, for example, a display device layer, such as an organic electroluminescent device, and a polarization plate, such as a circularly polarization plate, that are provided on the flexible substrate. The polarization plate includes a polarizer.

SUMMARY

Preventing infiltration of moisture into a polarizer has been required for a display unit.

It is desirable to provide a display unit that makes it possible to suppress moisture ingress into a polarizer.

A display unit according to one embodiment of the technology includes: a flexible substrate; a display device layer provided on the flexible substrate; a polarizer that is provided over the flexible substrate with the display device layer being interposed between the flexible substrate and the polarizer and has a first surface opposed to the flexible substrate, a second surface facing the first surface, and an end surface connecting the first surface and the second surface; a first moisture barrier film covering the first surface of the polarizer; and a second moisture barrier film that covers the second surface and the end surface of the polarizer, and is in contact with the first moisture barrier film.

A display unit according to one embodiment of the technology includes: a flexible substrate; a display device layer provided on the flexible substrate; a polarizer that is provided over the flexible substrate with the display device layer being interposed between the flexible substrate and the polarizer and has a first surface opposed to the flexible substrate, a second surface facing the first surface, and an end surface connecting the first surface and the second surface; a first moisture barrier film covering the first surface of the polarizer; a shock absorption layer that is in a gel-state and opposed to the display device layer with the polarizer being interposed between the shock absorption layer and the display device layer, and has a thickness of submillimeter order or greater; a shock dispersion layer that is opposed to the display device layer with the shock absorption layer being interposed between the shock dispersion layer and the display device layer and has a pencil hardness of 3H or higher; and a second moisture barrier film that is provided between the shock dispersion layer and the shock absorption layer, covers the second surface of the polarizer, and has a higher bending strength and a higher tensile strength than the shock dispersion layer.

BRIEF DESCRIPTION OF THE DRAWINGS

The accompanying drawings are included to provide a further understanding of the technology and are incorporated in and constitute a part of this specification. The drawings illustrate example embodiments and, together with the specification, serve to explain the principles of the technology.

DETAILED DESCRIPTION

In the following, some embodiments of the disclosure are described in detail with reference to the accompanying drawings. Note that sizes, materials, specific values, and any other factors illustrated in respective embodiments are illustrative for easier understanding of the technology, and are not intended to limit the scope of the technology unless otherwise specifically stated. Further, elements in the following example implementations which are not recited in a most-generic independent claim of the disclosure are optional and may be provided on an as-needed basis. Throughout the present specification and the drawings, elements having substantially the same function and configuration are denoted with the same reference numerals to avoid any redundant description. Further, elements that are not directly related to the technology are unillustrated in the drawings. The drawings are schematic and are not intended to be drawn to scale. Note that the description is given in the following order.

1. First Embodiment (Example Display Unit Including First Moisture Barrier Film and Second Moisture Barrier Film)

2. Modification Example 1 (Example Including Second Moisture Barrier Film Provided Directly on Second Surface of Polarizer)

3. Modification Example 2 (Example Including First Moisture Barrier Film Covering First Surface of Polarizer with Flexible Substrate Being Interposed Therebetween)

4. Second Embodiment (Example Display Unit Including First Moisture Barrier Film, Second Moisture Barrier Film, Shock Absorption Layer, and Shock Dispersion Layer)

5. Modification Example 3 (Example Including First Moisture Barrier Film Covering First Surface of Polarizer with Flexible Substrate Being Interposed Therebetween)

6. Modification Example 4 (Example Including Polarizer Having End Surface Not Covered with Second Moisture Barrier Film)
7. Application Example 1 (Example Display Unit)
8. Application Example 2 (Example Electronic Apparatus)

First Embodiment

[Configuration]

Figure 1:
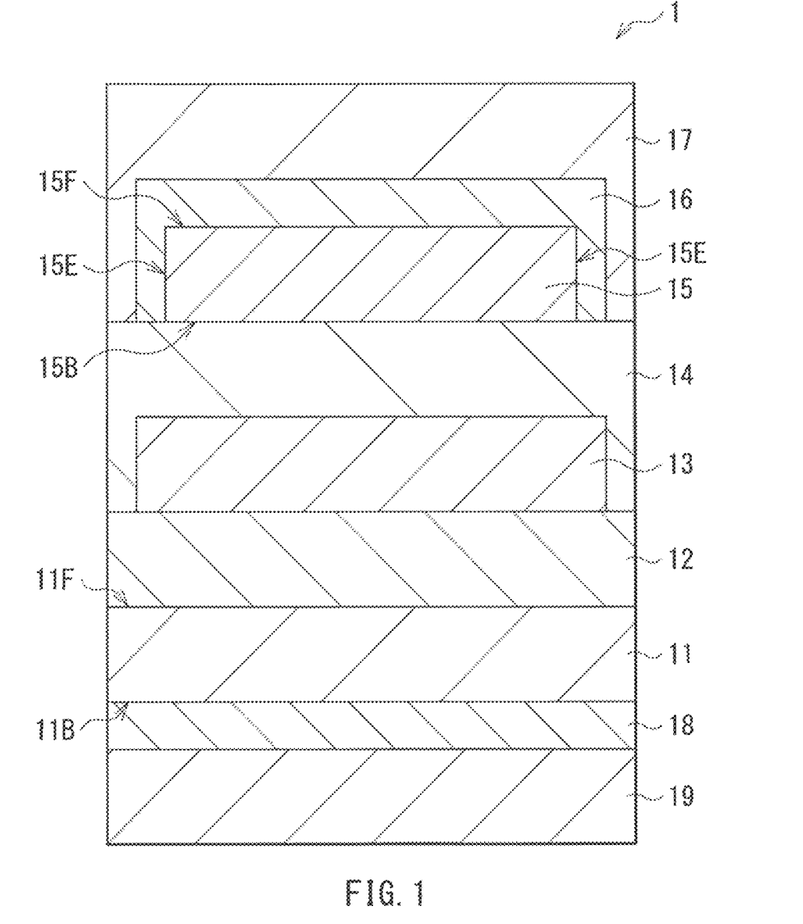
FIG. 1 is a schematic cross-sectional view of a display unit having an example outline configuration according to one embodiment of the technology.

FIG. 1 is a schematic cross-sectional view of a display unit 1 having an example outline configuration according to a first embodiment of the technology. For example, the display unit 1 may be a flexible display that includes an organic electroluminescent device provided on a flexible substrate 11. The substrate 11 may have a front surface 11F and a back surface 11B that face each other. The display unit 1 may include, for example but not limited to, an under coat (UC) film 12, a display device layer 13, a first moisture barrier film 14, a polarization plate 15, an adhesive layer 16, and a second moisture barrier film 17, in this order, on the front surface 11F of the substrate 11. The adhesive layer 16 may correspond to a specific but non-limiting example of "second adhesive layer" according to one embodiment of the technology. The display unit 1 may also include an adhesive layer 18 provided on the back surface 11B of the substrate 11, and a reinforce member 19 provided on the adhesive layer 18. The adhesive layer 18 may correspond to a specific but non-limiting example of "first adhesive layer" according to one embodiment of the technology.

The flexible substrate 11 may include a resin material, such as polyimide (PI). In other words, the substrate 11 may be a resin or plastic substrate. Alternatively, the substrate 11 may include, for example but not limited to, glass or metal. The substrate 11 may have a thickness in a range from 5 μm to 100 μm, for example.

The UC film 12 provided on the front surface 11F of the substrate 11 may suppress or prevent movement of substances, such as sodium ions, from the substrate 11 to an upper layer. The UC film 12 may include an insulating material, such as silicon nitride (SiN) or silicon oxide (SiO). Alternatively, the UC film 12 may be a laminate of a silicon nitride (SiN) film and a silicon oxide (SiO) film that are stacked in this order from a position adjacent to the substrate 11, for example. The UC film 12 may extend over the entire front surface 11F of the substrate 11, for example.

For example, non-illustrated thin-film transistors (TFT) may be provided between the UC film 12 and the display device layer 13. The thin-film transistors may be of a top-gate type, a bottom-gate type, or a dual-gate type. The thin-film transistor may each include a semiconductor layer provided in a selective region of the substrate 11. The semiconductor layer may include a channel region (e.g., an active layer), and may include an oxide semiconductor that includes, as a main component, an oxide of one or more elements of indium (In), gallium (Ga), zinc (Zn), tin (Sn), titanium (Ti), and niobium (Nb) without limitation. Specific but non-limiting examples of the oxide semiconductor may include indium-tin-zinc oxide (ITZO), indium-gallium-zinc oxide (IGZO: InGaZnO), zinc oxide (ZnO), indium-zinc oxide (IZO), indium-gallium oxide (IGO), indium-tin oxide (ITO), and indium oxide (InO). Alternatively, the semiconductor layer may include, for example but not limited to, a low temperature polycrystalline silicon (LTPS) or an amorphous silicon (a-Si).

The display device layer 13 provided over the front surface 11F of the substrate 11 may include a plurality of pixels, and an organic electroluminescent element that is driven to perform displaying by a backplane provided with the thin-film transistors described above. The organic electroluminescent element may include, for example but not limited to, an anode electrode, an organic layer including a light-emitting layer, and a cathode electrode, in this order from the UC film 12. The anode electrode may be coupled to a source-drain electrode of each of the thin-film transistors, for example. The cathode electrode may be supplied with a cathode potential that is common to the pixels through a wiring line, for example. The organic electroluminescent element may include, between the anode electrode and the light-emitting layer, a hole injection layer and a hole transport layer in this order from a position adjacent to the anode electrode. The organic electroluminescent element may include, between the cathode electrode and the light-emitting layer, an electron injection layer and an electron transport layer in this order from a position adjacent to the cathode electrode.

The first moisture barrier film 14 provided on the display device layer 13 may cover end portions of the display device layer 13, and may be in contact with the UC film 12. In other words, the display device layer 13 may be sealed between the first moisture barrier film 14 and the substrate 11. The first moisture barrier film 14 may serve as a sealing film to protect the display device layer 13 from the exterior. The first moisture barrier film 14 may include, for example but limited to, an inorganic material, such as silicon oxide ($SiO_x$), silicon nitride ($SiN_x$), silicon-oxide nitride (SiON), or aluminum oxide (AlO). The first moisture barrier film 14 may be a laminate of three or more layers that are made of the inorganic material or an organic material and are alternately stacked, for example. The first moisture barrier film 14 may have a thickness in a range from 0.1 μm to 20 μm, for example. In this embodiment, the first moisture barrier film 14 may have a moisture-vapor transmission rate of $1 \times 10^{-5}$ g/(m²·day) or less. Providing the first moisture barrier film 14 having such a low moisture-vapor transmission rate enhances reliability of the display device layer 13. The first moisture barrier film 14, which seals the display device layer 13, may cover a back surface 15B of the polarization plate 15 described below.

The polarization plate 15 provided on the first moisture barrier film 14 may have a back surface 15B, a front surface 15F, and an end surface 15E. The back surface 15B may be opposed to the substrate 11. The front surface 15F may face the back surface 15B. The end surface 15E may connect the front surface 15F and the back surface 15B. The back surface 15B of the polarization plate 15 may be in contact with the first moisture barrier film 14, and the front surface 15F and the end surface 15E of the polarization plate 15 may be in contact with the adhesive layer 16, for example. The polarization plate 15 may be a circularly polarization plate, for example, and may suppress reflection of external light incident on the display unit 1.

Figure 2:
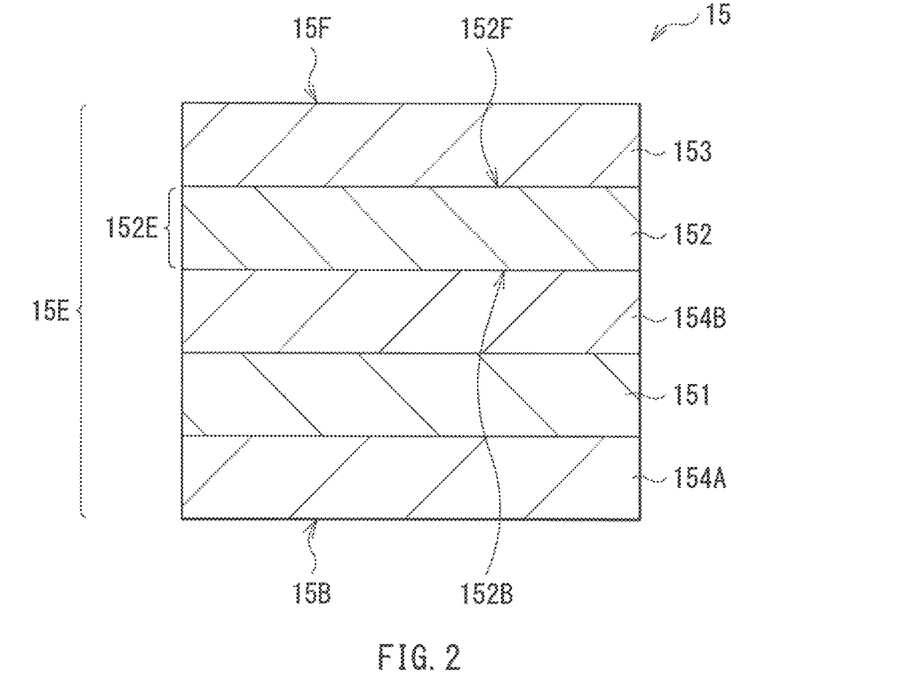
FIG. 2 is a schematic cross-sectional view of an example polarization plate illustrated in FIG. 1.

FIG. 2 illustrates an example configuration of the polarization plate 15. The polarization plate 15 may include, for example but not limited to, a retardation layer 151, a polarizer 152, and a protective film 153, in this order from a position adjacent to the back surface 15B or the substrate 11. An adhesive layer 154A may be provided between the retardation layer 151 and the first moisture barrier film 14 (refer to FIG. 1), and an adhesive layer 154B may be provided between the retardation layer 151 and the polarizer 152.

For example, the retardation layer 151 may cause a phase difference of ¼ wavelength between two polarization components, and may include polycarbonate (PC).

The polarizer 152 may cause a linear polarization, and may include a polyvinyl alcohol (PVA)-based film. The polarizer 152 has a back surface 152B, a front surface 152F, and end surface 152E. The back surface 152B is opposed to the substrate 11. The front surface 152F faces the back surface 152B. The end surface 152E connects the front surface 152F and the back surface 152B. The back surface 152B may correspond to a specific but non-limiting example of a "first surface" according one embodiment of the technology. The front surface 152A may correspond to a specific but non-limiting example of a "second surface" according one embodiment of the technology. The back surface 152B of the polarizer 152 may be adjacent to the back surface 15B of the polarization plate 15, and the front surface 152F of the polarizer 152 may be adjacent to the front surface 15F of the polarization plate 15. The end surface 15E of the polarization plate 15 may include the end surface 152E of the polarizer 152.

The protective film 153 may protect the polarizer 152 and the retardation layer 151, and may include, for example but not limited to, cellulose triacetate (TAC).

An end surface of the protective film 153 and an end surface of the retardation layer 151 may be aligned with the end surface 152E of the polarizer 152. The end surface 15E of the polarization plate 15 may include the end surface of the protective film 153 and the end surface of the retardation layer 151 as well as the end surface 152E of the polarizer 152.

The adhesive layer 154A may bond the retardation layer 151 to the first moisture barrier film 14, and the adhesive layer 154B may bond the polarizer 152 to the retardation layer 151.

In this embodiment, the front surface 15F and the end surface 15E of the polarization plate 15 may be covered with the second moisture barrier film 17 with the adhesive layer 16 being interposed therebetween. The second moisture barrier film 17 may be in contact with a portion of the first moisture barrier film 14 located around the polarization plate 15. In other words, the polarization plate 15 may be sealed between the first moisture barrier film 14 and the second moisture barrier film 17. This makes it possible to suppress moisture infiltration into the polarization plate 15, in particular, into the polarizer 152. The second moisture barrier film 17 covers the front surface 152F of the polarizer 152 with the protective film 153 and the adhesive layer 16 being interposed therebetween, for example.

Figure 3:
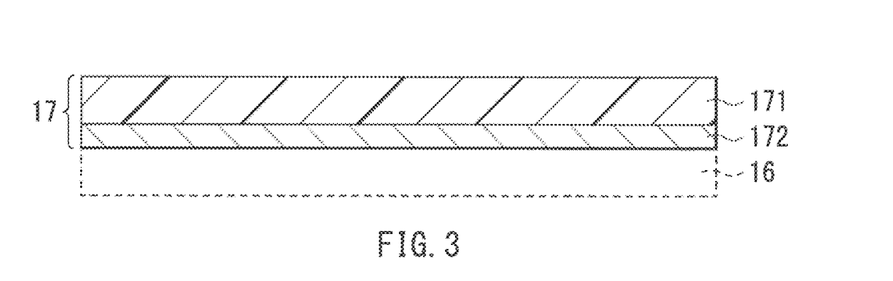
FIG. 3 is a schematic cross-sectional view of an example second moisture barrier film illustrated in FIG. 1.

FIG. 3 schematically illustrates an example configuration of the second moisture barrier film 17. The second moisture barrier film 17 may include, for example but not limited to, a resin film 171 and a barrier layer 172 provided on the resin film 171. The barrier layer 172 may be formed by depositing an inorganic material, such as silicon oxide ($SiO_x$), silicon nitride ($SiN_x$), silicon-oxide nitride (SiON), or aluminum oxide (AlO), on the resin film 171 by chemical vapor deposition (CVD) or atomic layer deposition (ALD), for example. In this embodiment, the barrier layer 172 may be in contact with the adhesive layer 16. The second moisture barrier film 17 may have a thickness in a range from 0.1 μm to 20 μm, for example. For example, the second moisture barrier film 17 having such a thickness may cover the front surface 15F and the end surface 15E of the polarization plate 15. In other words, the second moisture barrier film 17 opposed to the front surface 15F and the end surface 15E of the polarization plate 15 may have a thickness in a range from 0.1 μm to 20 82 m. In an example embodiment of the technology, the second moisture barrier film 17 may have a moisture-vapor transmission rate of $1 \times 10^{-3}/(m^2 \cdot day)$ or less. The second moisture barrier film 17 may extend above and around the the polarization plate 15, and is in contact with the portion of the first moisture barrier film 14 located around the polarization plate 15.

The adhesive layer 16 provided between the second moisture barrier film 17 and the polarization plate 15 may bond the second moisture barrier film 17 to the polarization plate 15. In an example embodiment of the technology, the adhesive layer 16 may have a moisture barrier property and a moisture-vapor transmission rate of $10 \text{ g}/(m^2 \cdot day)$ or less.

The adhesive layer 18 provided between the back surface 11B of the substrate 11 and the reinforce member 19 may bond the substrate 11 and the reinforce member 19. The adhesive layer 18 may include, for example but not limited to, an acrylic adhesive material.

The reinforce member 19 may be opposed to the back surface 11B of the substrate 11 with the adhesive layer 18 being therebetween. The reinforce member 19 may protect and reinforce the flexible substrate 11, and may be, for example but not limited to, a metal thin-film, such as a stainless-steel film, or a resin film, such as a polyethylene terephthalate (PET) film. The reinforce member 19 may impart rigidity to the substrate 11, or may have high heat dissipation. The reinforce member 19 may suppress occurrence of static electricity on the back surface 11B of the substrate 11. The reinforce member 19 may have a thickness in a range from 5 μm to 100 μm, for example.

[Workings and Example Effects]

In the display unit 1, each pixel in the display device layer 13 may be driven to perform displaying in response to an external image signal. In this case, the thin-film transistors may be driven by a voltage per pixel, for example. In detail, upon application of a voltage equal to or greater than a threshold voltage to the thin-film transistor, the semiconductor layer described above may be activated (i.e., a channel may be formed), causing an electric current to flow through paired source-drain electrodes of the thin-film transistor. Image displaying by the display unit 1 may be performed utilizing the voltage driving of the thin-film transistor.

The display unit 1 according to the first embodiment of the technology includes the first moisture barrier film 14 covering the back surface 15B of the polarization plate 15, and the second moisture barrier film 17 covering the front surface 15F and the end surface 15E of the polarization plate 15. The second moisture barrier film 17 may be in contact with the portion of the first moisture barrier film 14 located around the polarization plate 15. This makes it possible to seal the polarization plate 15 between the first moisture barrier film 14 and the second moisture barrier film 17, and thereby suppress moisture infiltration from the exterior into the polarization plate 15, in particular, into the polarizer 152. These workings and example effects will now be described in detail.

In general, a polarizer of a polarization plate may be a highly hygroscopic resin film, such as a polyvinyl alcohol-based film. When absorbing moisture, the polarization plate may swell and significantly change its dimensions. Such a change in dimensions of the polarization plate can cause a distortion of the flexible substrate of the flexible display. The distortion of the flexible substrate can cause a distortion, such as warping, of the entire display. In the case of a thin glass substrate, the distortion of the substrate can result in cracking.

In the display unit 1, the polarization plate 15 is sealed between the first moisture barrier film 14 covering the back surface 15B of the polarization plate 15 and the second moisture barrier film 17 covering the front surface 15F and the end surface 15E of the polarization plate 15. The first moisture barrier film 14 and the second moisture barrier film 17 block moisture infiltration from the exterior into the polarization plate 15. Accordingly, it is possible to suppress moisture infiltration into the polarization plate 15. This helps to suppress a change in dimensions of the polarization plate 15 due to moisture.

According to the first embodiment of the technology described above, providing the first moisture barrier film 14 and the second moisture barrier film 17 makes it possible to suppress moisture infiltration from the exterior into the polarizer 152. Accordingly, it is possible to suppress moisture infiltration into the polarizer 152. It is also possible to suppress a distortion, such as warping, of the display unit 1 including the flexible substrate 11, and cracking of the flexible substrate 11.

Some modification examples and other embodiments of the technology will now be described. In the following description, elements or components identical to those in the foregoing embodiment are denoted with the same reference numerals without any redundant description.

[Modification Example 1]

Figure 4:
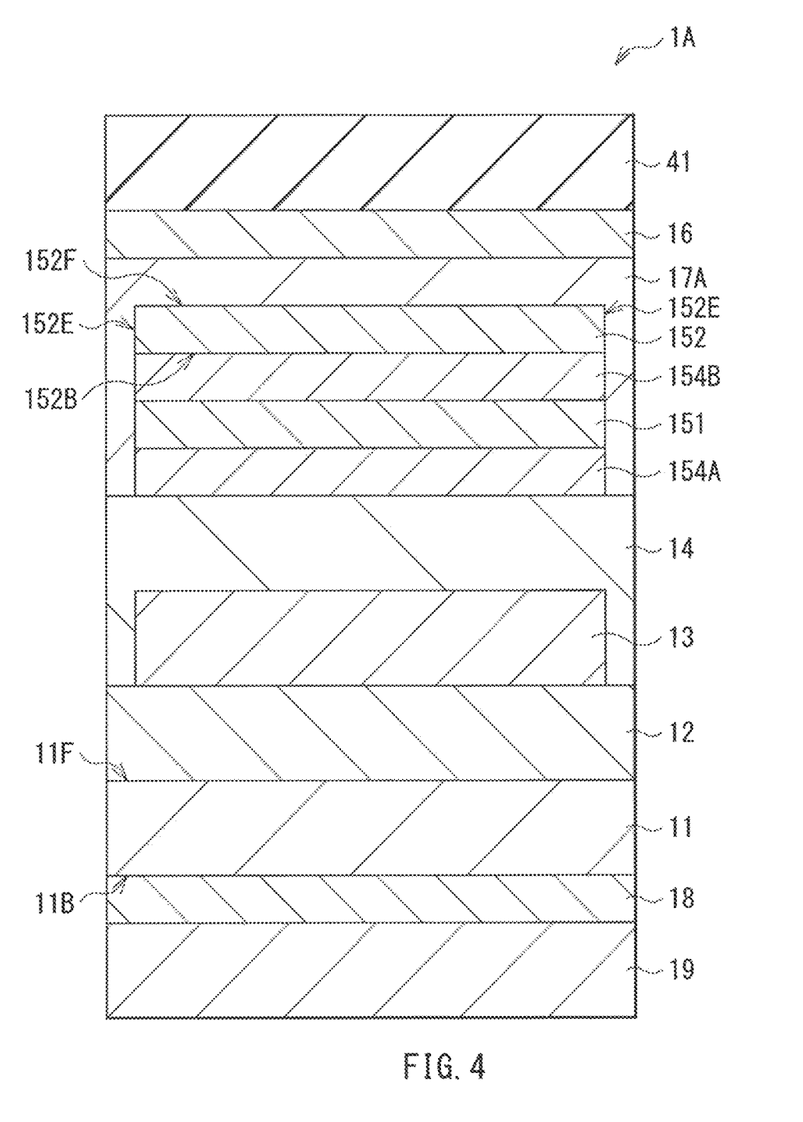
FIG. 4 is a schematic cross-sectional view of a display unit having an example outline configuration according to one modification example of the technology.

FIG. 4 is a schematic cross-sectional view of a display unit 1A according to Modification Example 1 of the first embodiment described above. The display unit 1A includes a second moisture barrier film 17A that directly covers the front surface 152F and end faces 152E of the polarizer 152. Except for this configuration, the display unit 1A may have a similar configuration to the display unit 1 of the first embodiment described above. The workings and example effects of the display unit 1A of Modification Example 1 may also be similar to those of the display unit 1 of the first embodiment.

The display unit 1A may include the UC film 12, the display device layer 13, the first moisture barrier film 14, the adhesive layer 154A, the retardation layer 151, the adhesive layer 154B, the polarizer 152, the second moisture barrier film 17A, the adhesive layer 16, and a protective film 41, in this order, on the front surface 11F of the substrate 11. In other words, the second moisture barrier film 17A may be provided between the polarizer 152 and the protective film 41. The back surface 152B of the polarizer 152 is covered with the first moisture barrier film 14, and the front surface 152F and the end surface 152E of the polarizer 152 are covered with the second moisture barrier film 17A.

The second moisture barrier film 17A is in contact with the front surface 152F and the end surface 152E of the polarizer 152. The second moisture barrier film 17A may extend above and around the the polarizer 152, and is in contact with a portion of the first moisture barrier film 14 located around the polarizer 152.

The second moisture barrier film 17A may be an inorganic material film that includes, for example but not limited to, silicon nitride (SiNx) or aluminum oxide (AlOx). The inorganic material film may be formed by CVD or atomic layer deposition (ALD), for example. In an example embodiment of the technology, the second moisture barrier film 17 may have a moisture-vapor transmission rate of $1 \times 10^{-3}$ g/(m$^2$·day) or less. The protective film 41 may be bonded to the second moisture barrier film 17A by the adhesive layer 16.

The protective film 41 may cover the polarizer 152 with the second moisture barrier film 17A being interposed therebetween. Like the protective film 153 of the display unit 1, the protective film 41 may protect the retardation layer 151 and the polarizer 152, and may include, for example but not limited to, cellulose triacetate (TAC).

In the display unit 1A, the polarizer 152 is sealed between the first moisture barrier film 14 covering the back surface 152B of the polarizer 152 and the second moisture barrier film 17A covering the front surface 152F and the end surface 152E of the polarizer 152. As in the display unit 1, it is possible also in the display unit 1A to suppress moisture infiltration into the polarizer 152.

[Modification Example 2]

Figure 5:
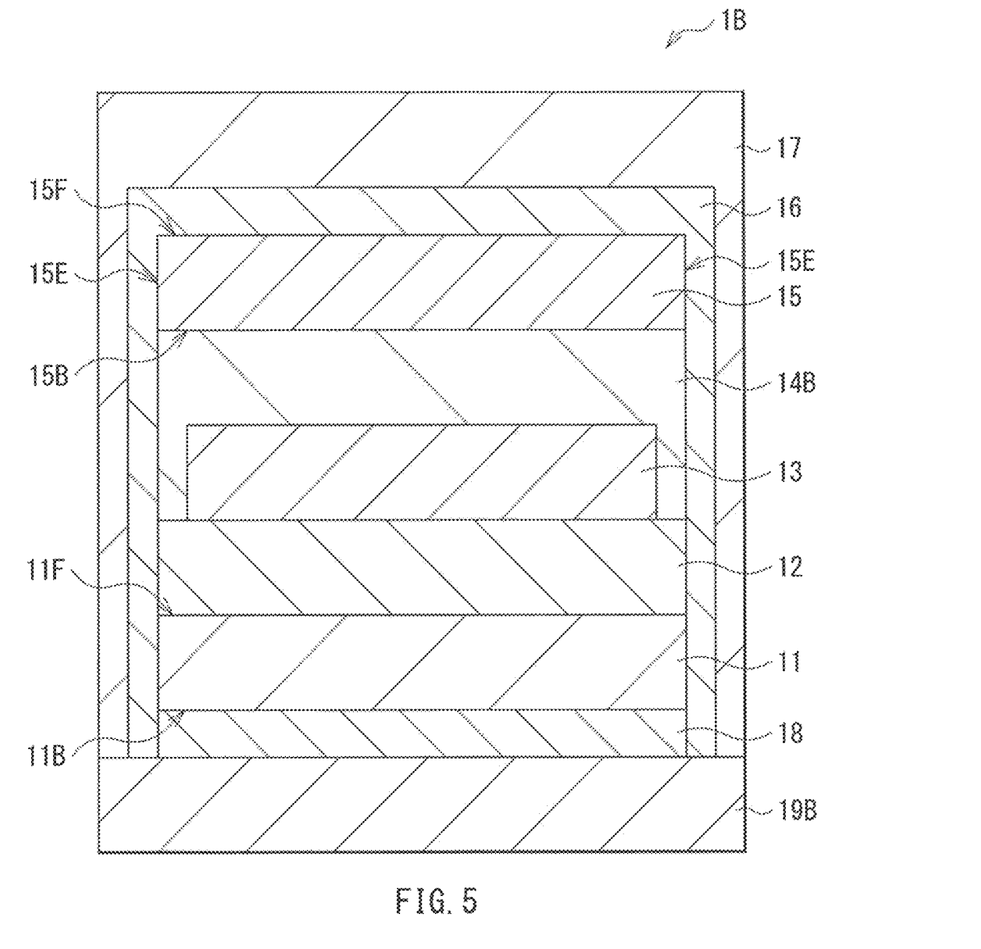
FIG. 5 is a schematic cross-sectional view of a display unit having an example outline configuration according to one modification example of the technology.

FIG. 5 is a schematic cross-sectional view of a display unit 1B according to Modification Example 2 of the first embodiment described above. The display unit 1B includes a first moisture barrier film 19B that is provided over the back surface 11B of the substrate 11 with the adhesive layer 18 being interposed therebetween. Except for this configuration, the display unit 1B may have a similar configuration to the display unit 1 of the first embodiment described above. The workings and example effects of the display unit 1B of Modification Example 2 may also be similar to those of the display unit 1 of the first embodiment.

The display unit 1B may include the UC film 12, the display device layer 13, a sealing film 14B, the polarization plate 15, the adhesive layer 16, and the second moisture barrier film 17, in this order, on the front surface 11F of the substrate 11. The display unit 1B also includes the first moisture barrier film 19B that is provided over the back surface 11B of the substrate 11 with the adhesive layer 18 being interposed therebetween. The back surface 15B of the polarization plate 15 is covered with the first moisture barrier film 19B, and the front surface 15F and the end surface 15E of the polarization plate 15 are covered with the second moisture barrier film 17.

The first moisture barrier film 19B may be opposed to the substrate 11 with the adhesive layer 18 being interposed therebetween, and may be bonded to the back surface 11B of the substrate 11 by the adhesive layer 18. The first moisture barrier film 19B covers the back surface 15B of the polarization plate 15 with the display device layer 13 and the substrate 11 being interposed therebetween. The first moisture barrier film 19B may cover the back surface 11B of the substrate 11 and may extend to a region around the substrate 11. The second moisture barrier film 17 is in contact with a portion of the first moisture barrier film 19B located around the provided substrate 11. In an example embodiment of the technology, the first moisture barrier film 19B may protect and reinforce the substrate 11, besides suppressing moisture infiltration into the polarization plate 15.

The first moisture barrier film 19B may be, for example but not limited to, a metal film. The first moisture barrier film 19B configured by the metal film may have high heat dissipation. Specific but non-limiting example of the material of the metal film may include 42 alloy (42 Ni), stainless steel (SUS), magnesium (Mg) alloy, aluminum (Al), and copper (Cu). For example, the first moisture barrier film 19B may include a material resistant to plastic deformation. The first moisture barrier film 19B may have a similar configuration to the second moisture barrier film 17, and may include, for example but not limited to, the resin film and the barrier layer that are illustrated in FIG. 3. In an example embodiment of the technology, the first moisture barrier film 19B may have a moisture-vapor transmission rate of $1 \times 10^{-3}$ g/(m$^2$·day) or less.

The sealing film 14B provided on the display device layer 13 may cover end surface of the display device layer 13, and may be in contact with the UC film 12. In other words, the display device layer 13 may be sealed between the sealing film 14B and the substrate 11. The sealing film 14B may protect the display device layer 13 from the exterior. The sealing film 14B may include, for example but not limited to, an inorganic material, such as silicon oxide ($SiO_x$), silicon nitride ($SiN_x$), silicon-oxide nitride (SiON), or aluminum oxide (AlO).

In the display unit 1B, the polarization plate 15 may be sealed between the first moisture barrier film 19B covering the back surface 15B of the polarization plate 15 and the second moisture barrier film 17 covering the front surface 15F and the end surface 15E of the polarization plate 15. As in the display unit 1, it is possible also in the display unit 1B to suppress moisture infiltration into the polarizer 152.

Second Embodiment

Figure 6:
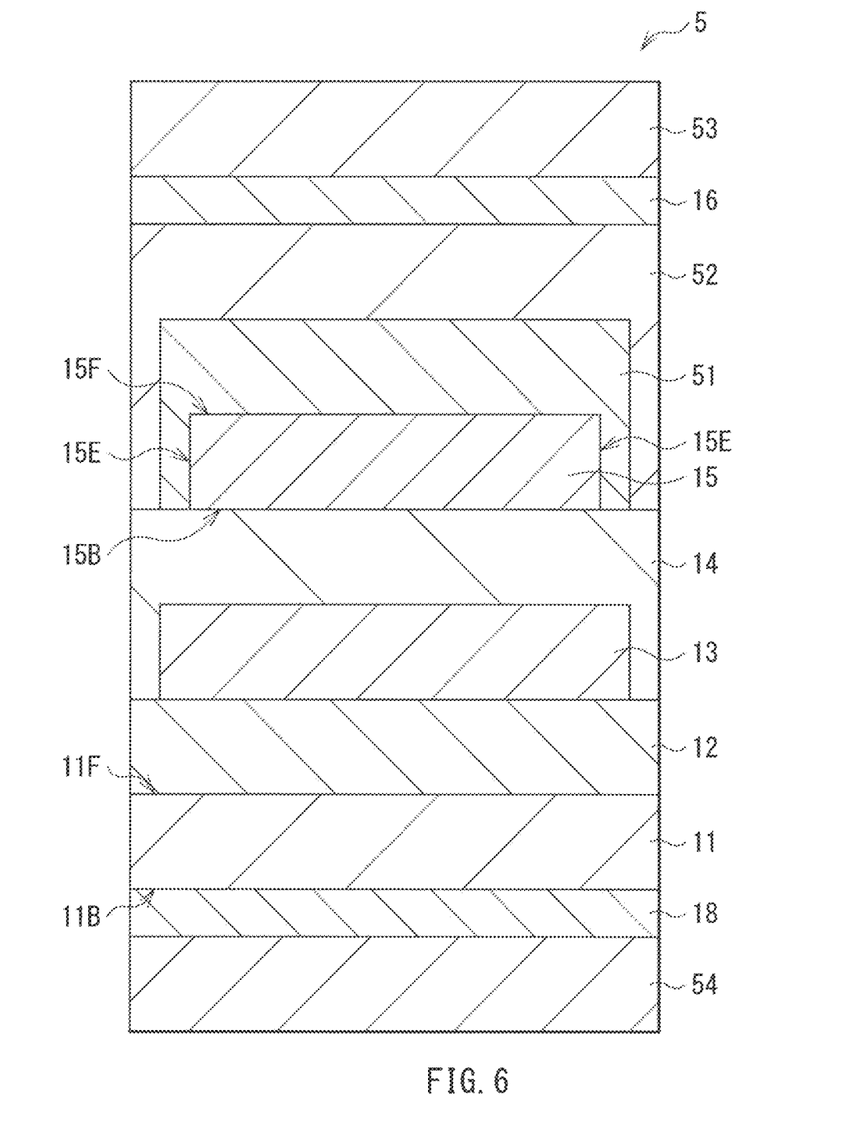
FIG. 6 is a schematic cross-sectional view of a display unit having an example outline configuration according to one embodiment of the technology.

FIG. 6 is a schematic cross-sectional view of a display unit 5 having an example outline configuration according to a second embodiment of the technology. The display unit 5 may have a shock-resistant structure. Except for this configuration, the display unit 5 may have a similar configuration to the display unit 1 of the first embodiment described above. The workings and example effects of the display unit 5 of the second embodiment may also be similar to those of the display unit 1 of the first embodiment.

The display unit 5 may include the UC film 12, the display device layer 13, the first moisture barrier film 14, the polarization plate 15, a shock absorption layer 51, the second moisture barrier film 52, the adhesive layer 16, and a shock dispersion layer 53, in this order, on the front surface 11F of the substrate 11. The display unit 5 may also include a buffer layer 54 that is provided over the back surface 11B of the substrate 11 with the adhesive layer 18 being interposed therebetween. The shock-resistant structure of the display unit 5 may include, for example but not limited to, the shock absorption layer 51, the second moisture barrier film 52, and the shock dispersion layer 53 that are provided over the polarization plate 15.

The shock dispersion layer 53 that is opposed to the display device layer 13 with the shock absorption layer 51 being interposed therebetween may disperse external impact force exerted thereon to suppress or prevent the external impact force from concentrating on one point. The shock dispersion layer 53 may also suppress or prevent damage such as scratches on a surface. The shock dispersion layer 53 may be a resin film having a pencil hardness of 3H or higher. An upper limit of the hardness of the shock dispersion layer 53 may not be limited to a particular value. For example, the shock dispersion layer 53 may be a resin film having a pencil hardness of 10H or less. A general measure to strengthen the hardness of the resin film may involve applying or depositing a hard-coating material on a surface of a substrate of the resin film. Such hard-coating treatments on one surface of the film substrate, however, is likely to cause warping of the film substrate, which can hinder a bonding process. Another general measure to strengthen the hardness of the resin film may involves bonding a film having one hard-coated surface (hereinafter referred to as a "one-side hard-coat (HC) treated film") to the resin film. This measure, however, can cause cracking or warping of the resin film due to residual stress. To address such a concern, in this example embodiment of the technology, the shock dispersion layer 53 may be a molded film including a hard-coating material (hereinafter referred to as a "hard coat (HC) film") or a film of which substrate has two hard-coated surfaces (hereinafter referred to as a "both-side hard-coat (HC) treated film").

The HC film and the both-side HC treated film are highly resistant to warping and may have a desired pencil hardness, Young's modulus, or thickness. The HC film and the both-side HC treated film are thus suitable for the shock dispersion layer 53.

When the shock dispersion layer 53 receives external impact force, the shock absorption layer 51 that is opposed to the display device layer 13 with the polarization plate 15 being interposed therebetween may deform conforming to a curvature of the shock dispersion layer 53 to absorb the external impact force (i.e., exhibit a shock-absorptive property). The shock absorption layer 51 may be a gel-like resin layer having a thickness of submillimeter order or greater. In an example embodiment of the technology, the shock absorption layer 51 configured by the gel-like resin layer may have an Asker C hardness in a range from 30 to 80. The shock absorption layer 51 having an Asker C hardness of less than 30 can be crashed by the impact force to insufficiently absorb the impact force. The shock absorption layer 51 having an Asker C hardness of greater than 80 can deform too slightly upon the application of the impact force to sufficiently absorb the impact force. The Asker C hardness as used herein refers to the hardness measured with an Asker Type C hardness tester in accordance with Japanese Industrial Standard (JIS) S6050. In this embodiment of the technology where the shock dispersion layer 53 is provided, the shock absorption layer 51 may have a thickness smaller (e.g., by about 2 mm) than that required in an embodiment where the shock dispersion layer 53 is not provided.

In another example embodiment of the technology, the shock absorption layer 51 may be a gel-like adhesive layer. In this embodiment, the shock absorption layer 51 may be in contact with the front surface 15F and the end surface of the polarization plate 15, and may bond the second moisture barrier film 52 to the polarization plate 15 (i.e., may have a bonding property). The shock absorption layer 51 configured by the gel-like adhesive layer may include, for example but not limited to, an acrylic gel-like adhesive. Possible examples of the gel-like adhesive may include a silicone gel; however, the shock absorption layer 51 including a silicone gel can cause seeping of oil, which can reduce the reliability of the display.

In an example embodiment of the technology, the shock absorption layer 51 may have a moisture barrier property, and may have a moisture-vapor transmission rate of 10 $g/(m^2 \cdot day)$ or less, for example. The display unit 5, which has the shock-resistant structure and a higher rigidity than the display unit 1, is resistant to a distortion, regardless of the shock absorption layer 51 having a low moisture barrier property.

The second moisture barrier film 52 may cover the front surface 15F and the end surface 15E of the polarization plate 15 with the shock absorption layer 51 being interposed therebetween, and may be in contact with the portion of the first moisture barrier film 14 located around the polarization plate 15. The second moisture barrier film 52 may serve to suppress moisture infiltration from the exterior into the polarization plate 15 and may serve as the shock-resistant structure for mitigating a distortion (i.e., may have a distortion mitigating property).

The distortion mitigating property of the second moisture barrier film 52 may enhance resistance of the shock dispersion layer 53 to cracking due to a load. In a case where the shock absorption layer 51 that is a significantly soft layer is provided below the shock dispersion layer 53 that is highly resistant to bending, the shock dispersion layer 53 can be largely warped by a load and cracked beyond its flexural strain at break point, in spite of its high bending resistance. To address such a concern, in this example embodiment of the technology, the second moisture barrier film 52 provided between the shock dispersion layer 53 and the shock absorption layer 51 may have the distortion mitigating property in order to enhance the resistance of the shock dispersion layer 53 to cracking due to a load.

The second moisture barrier film 52 may include a resin film (e.g., the resin film 171 of FIG. 3) having a higher bending strength and a higher tensile strength than the shock dispersion layer 53. The resin film may be, for example but not limited to, a PET film. The second moisture barrier film 52 may also include, for example but not limited to, a barrier layer (e.g., the barrier layer 172 of FIG. 3) as well as the resin film. The barrier layer may be a film of an inorganic material, such as silicon oxide ($SiO_x$), silicon nitride ($SiN_x$), silicon-oxide nitride (SiON), or aluminum oxide (AlO), formed on the resin film using chemical vapor deposition or atomic layer deposition, for example. In this embodiment, the barrier layer may be in contact with the shock absorption layer 51. In an example embodiment of the technology, the second moisture barrier film 52 may have a moisture-vapor transmission rate of $1\times10^{-3}$ g/($m^2$·day) or less.

Specific but non-limiting examples of a combination of the shock dispersion layer 53 and the second moisture barrier film 52 are as follows:

| Shock Dispersion Layer 53 | Second Moisture Barrier Film 52 |
|---|---|
| 1. Organic/Inorganic Hybrid HC film | PET |
| 2. Organic/Inorganic Hybrid HC film | TAC |
| 3. Organic/Inorganic Hybrid HC film | PI |
| 4. PET Substrate HC Treated Film | PET |
| 5. PET Substrate HC Treated Film | TAC |
| 6. PET Substrate HC Treated Film | PI |
| 7. TAC Substrate HC Treated Film | PET |
| 8. TAC Substrate HC Treated Film | TAC |
| 9. TAC Substrate HC Treated Film | PI |
| 10. PC Substrate HC Treated Film | PET |
| 11. PC Substrate HC Treated Film | TAC |
| 12. PC Substrate HC Treated Film | PI |
| 13. PMMA Substrate HC Treated Film | PET |
| 14. PMMA Substrate HC Treated Film | TAC |
| 15. PMMA Substrate HC Treated Film | PI |

HC film: a molded film including a hard-coating material
Organic/Inorganic Hybrid: a hard-coating material that is a mixture of an organic material and an inorganic material
HC treated film: a film of which substrate has a hard-coated surface
PET substrate: a film substrate including PET
TAC substrate: a film substrate including TAC
PC substrate: a film substrate including PC
PMMA substrate: a film substrate including PMMA The buffer layer 54 may be bonded to the back surface 11B of the substrate 11 by the adhesive layer 18. The buffer layer 54, the shock absorption layer 51, the second moisture barrier film 52, and the shock dispersion layer 53 may constitute the shock-resistant structure. The buffer layer 54 may reduce a local flexure upon application of impact force to the display unit 5, and may also impart rigidity to the substrate 11, for example. In an example embodiment of the technology, the buffer layer 54 may have a high Young's modulus, and may include a material resistant to plastic deformation. The buffer layer 54 may be a metal film including, for example but not limited to, 42 alloy (42 Ni), stainless steel (SUS), magnesium (Mg) alloy, aluminum (Al), or copper (Cu).

The buffer layer 54 may be omitted in a case where sufficient rigidity is secured by the shock absorption layer 51, the second moisture barrier film 52, and the shock dispersion layer 53 that are provided over the front surface 11F of the substrate 11. Omitting the buffer layer 54 may reduce the thickness of the display unit 5.

In the display unit 5, the polarization plate 15 may be sealed between the first moisture barrier film 14 covering the back surface 15B of the polarization plate 15 and the second moisture barrier film 52 covering the front surface 15F and the end surface 15E of the polarization plate 15. As in the display unit 1, it is possible also in the display unit 5 to suppress moisture infiltration into the polarizer 152.

Additionally, the following example effects may be obtained by the display unit 5 having the shock-resistant structure.

Application of external impact force can result in scratches on a surface of the display, a breakage of the interior of the display, or malfunction of the display. A typical flexible display, for example, may be disadvantageous in its low shock-resistance whereas advantageous in its thinness, lightness, and flexibility. A typical measure to improve the shock-resistance of the flexible display involves bonding a reinforcing glass on a surface of the display. Such a typical measure, however, can increase the weight and thickness of the display. Further, bonding the reinforcing glass to the surface of the flexible display can impair thinness, lightness, or flexibility of the display.

In contrast, in this embodiment of the technology, the shock absorption layer 51 provided below the shock dispersion layer 53 may be a gel-like resin layer having a thickness of submillimeter order or greater. Upon application of impact force to the shock dispersion layer 53, the shock absorption layer 51 may deform conforming to a curvature of the shock dispersion layer 53 to absorb the external impact force. Such a property is not be available by a thin adhesive layer simply designed for adhesion.

Further, in this embodiment of the technology, the second moisture barrier film 52 having a higher bending strength and a higher tensile strength than the shock dispersion layer 53 may be provided between shock dispersion layer 53 and the shock absorption layer 51. This helps to reduce occurrence of cracking of the shock dispersion layer 53 beyond the flexural strain at break point, even in a case where the shock absorption layer 51 provided below the shock dispersion layer 53 is a significantly soft layer. Accordingly, it is possible in this embodiment to absorb external impact force while suppressing the occurrence of cracking without the use of a reinforcing glass.

In the example embodiment where the shock absorption layer 51 may be a gel-like adhesive layer, the second moisture barrier film 52 may be bonded to the polarization plate 15. Additionally, in the example embodiment where the shock absorption layer 51 may include a gel-like acrylic adhesive, seeping of oil, such as silicone gel, is prevented or suppressed, which prevents or suppresses a reduction in reliability of the display.

[Modification Example 3]

Figure 7:
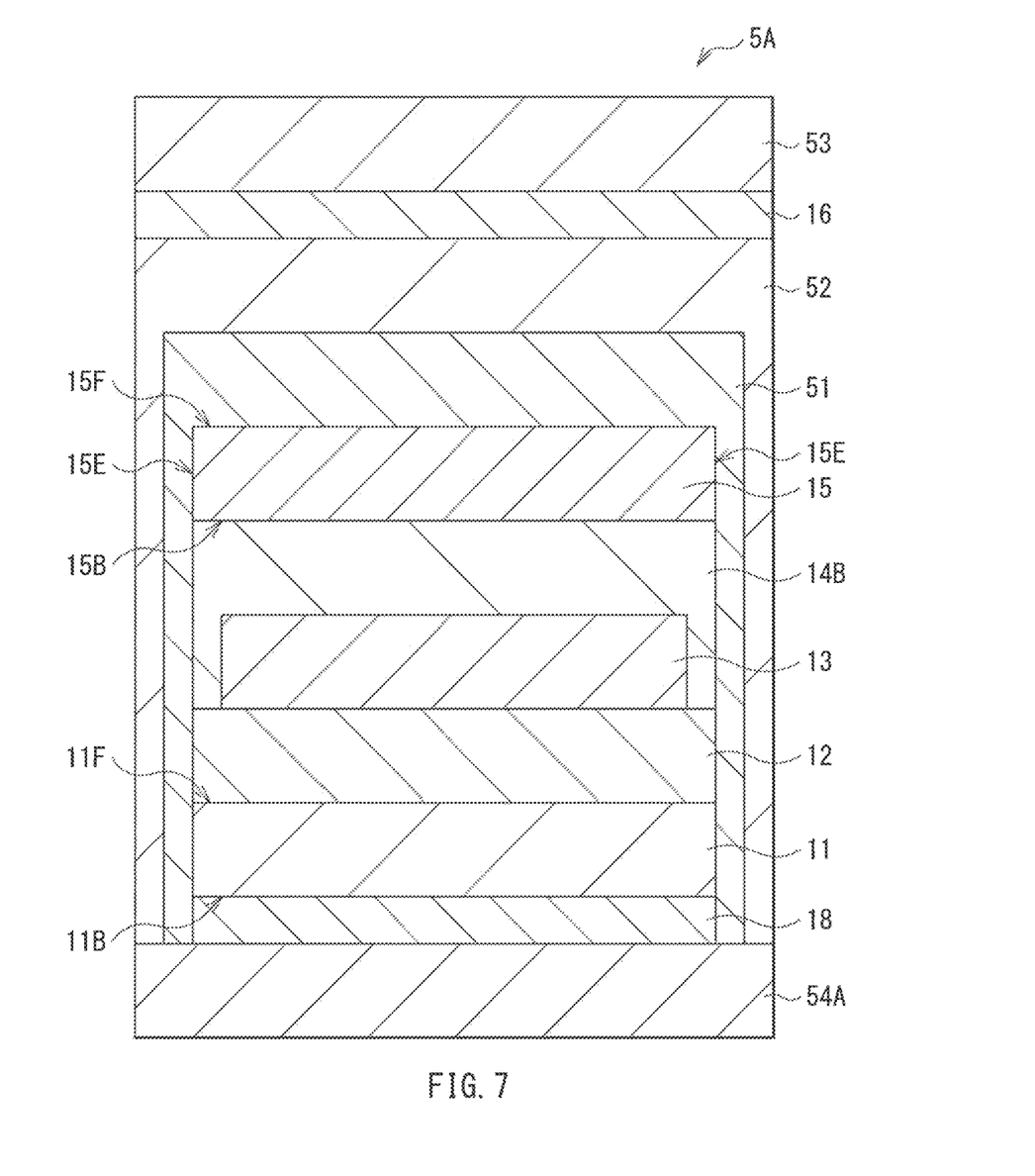
FIG. 7 is a schematic cross-sectional view of a display unit having an example outline configuration according to one modification example of the technology.

FIG. 7 is a schematic cross-sectional view of a display unit 5A according to Modification Example 3 of the second embodiment described above. The display unit 5A includes a first moisture barrier film 54A that is provided over the back surface 11B of the substrate 11 with the adhesive layer 18 being interposed therebetween. Except for this configuration, the display unit 5A may have a similar configuration to the display unit 5 of the second embodiment described above. The workings and example effects of the display unit 5A of Modification Example 3 may also be similar to those of the display unit 5 of the second embodiment.

The display unit 5A may include the UC film 12, the display device layer 13, the sealing film 14B, the polarization plate 15, the shock absorption layer 51, the second moisture barrier film 52, the adhesive layer 16, and the shock dispersion layer 53, in this order, on the front surface 11F of the substrate 11. The display unit 5A also includes the first moisture barrier film 54A that is provided over the back surface 11B of the substrate 11 with the adhesive layer 18 being interposed therebetween. The back surface 15B of the polarization plate 15 may be covered with the first moisture barrier film 54A, and the front surface 15F and the end surface 15E of the polarization plate 15 are covered with the second moisture barrier film 52.

The first moisture barrier film 54A may be opposed to the substrate 11 with the adhesive layer 18 being interposed therebetween, and may be bonded to the back surface 11B of the substrate 11 by the adhesive layer 18. The first moisture barrier film 54A may cover the back surface 15B of the polarization plate 15 with the display device layer 13 and the substrate 11 being interposed therebetween. The first moisture barrier film 54A may extend to a region around the substrate 11. A portion of the first moisture barrier film 54A that is located around the substrate 11 is in contact with the second moisture barrier film 52. In an example embodiment, the first moisture barrier film 54A may protect and reinforce the substrate 11, besides suppressing moisture infiltration into the polarization plate 15.

The first moisture barrier film 54A may be, for example but not limited to, a metal film. The first moisture barrier film 54A configured by the metal film may have high heat dissipation. Specific but non-limiting example of the material of the metal film may include 42 alloy (42 Ni), stainless steel (SUS), magnesium (Mg) alloy, aluminum (Al), and copper (Cu). The first moisture barrier film 54A may have a similar configuration to the second moisture barrier film 52, and may include, for example but not limited to, the resin film and the barrier layer that are illustrated in FIG. 3. In an example embodiment of the technology, the first moisture barrier film 54A may have a moisture-vapor transmission rate of $1 \times 10^{-3}$ g/(m$^2$·day) or less.

In the display unit 5A, the polarization plate 15 may be sealed between the first moisture barrier film 54A covering the back surface 15B of the polarization plate 15 and the second moisture barrier film 52 covering the front surface 15F and the end surface 15E of the polarization plate 15. As in the display unit 1, it is possible also in the display unit 5A to suppress moisture infiltration into the polarizer 152. Additionally, as in the display unit 5, it is possible also in the display unit 5A having the shock-resistant structure to absorb external impact force while suppressing the occurrence of cracking without the use of a reinforcing glass.

[Modification Example 4]

Figure 8:
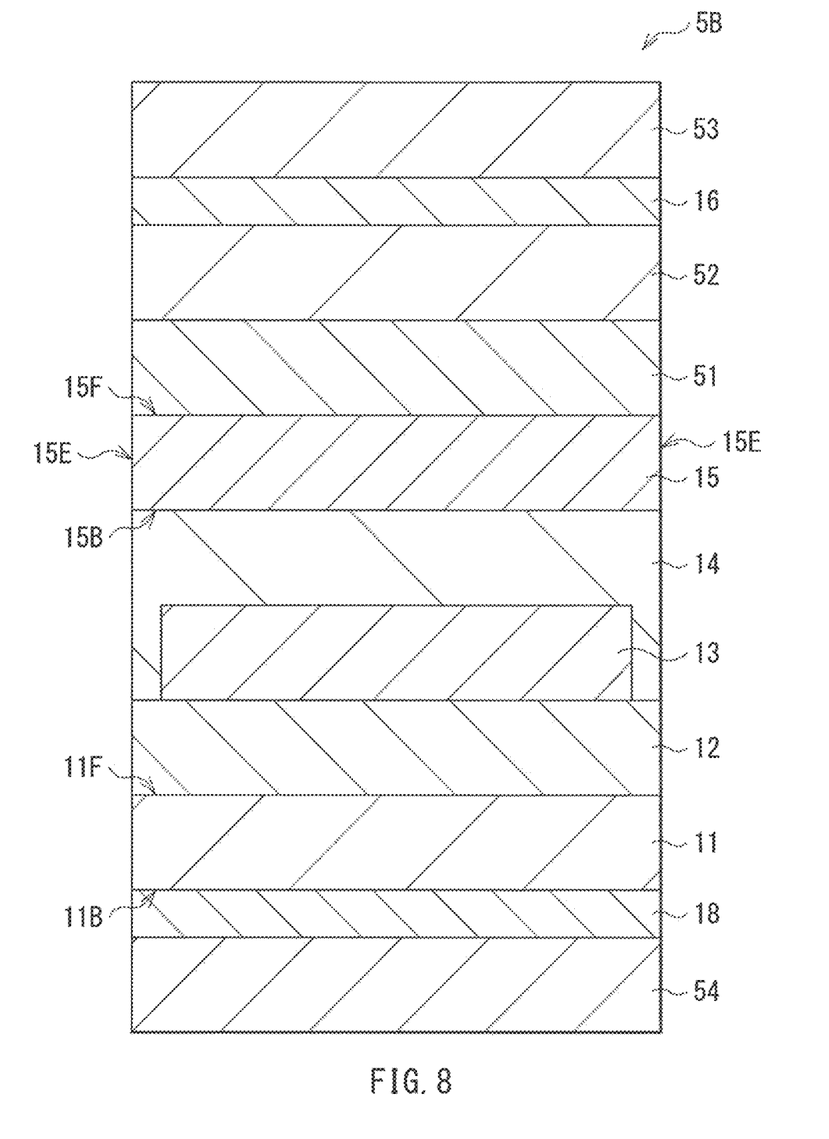
FIG. 8 is a schematic cross-sectional view of of a display unit having an example outline configuration according to one modification example of the technology.

FIG. 8 is a schematic cross-sectional view of a display unit 5B according to Modification Example 4 of the second embodiment described above. In the display unit 5B, the end surface 15E of polarization plate 15 may be uncovered with the second moisture barrier film 52. Except for this configuration, the display unit 5B may have a similar configuration to the display unit 5 of the second embodiment described above. The workings and example effects of the display unit 5B of Modification Example 4 may also be similar to those of the display unit 5 of the second embodiment.

In the display unit 5B, the second moisture barrier film 52 may have substantially the same size as the polarization plate 15. The second moisture barrier film 52 covers the front surface 15F of the polarization plate 15. The first moisture barrier film 14 covers the back surface 15B of the polarization plate 15. The end surface 15E of the polarization plate 15 may be uncovered with the first moisture barrier film 14 and the second moisture barrier film 52.

In the display unit 5B, the polarization plate 15 may be provided between the first moisture barrier film 14 covering the back surface 15B of the polarization plate 15 and the second moisture barrier film 52 covering the front surface 15F of the polarization plate 15. It is possible also in the display unit 5B to suppress moisture infiltration into the polarization plate 15 through the front surface 15F and the back surface 15B of the polarization plate 15. Accordingly, it is possible to suppress moisture infiltration into the polarizer 152. Further, the configuration of the display unit 5B eliminates the need for a contact region between the portion of the first moisture barrier film 14 located around the polarization plate 15 and the second moisture barrier film 52, which helps to reduce a so-called bezel region, compared with the display unit 5. Additionally, as in the display unit 5, it is possible also in the display unit 5B having the shock-resistant structure to absorb external impact force while suppressing the occurrence of cracking without the use of a reinforcing glass.

APPLICATION EXAMPLES

Now described is an example electronic apparatus to which the display unit 1, 1A, 1B, 5, 5A, or 5B (hereinafter collectively referred to as "display unit 1") according to any foregoing embodiment is applied.

Firstly, an example block configuration of the display unit 1 is described.

[Block Configuration of Display Unit 1]

Figure 9:
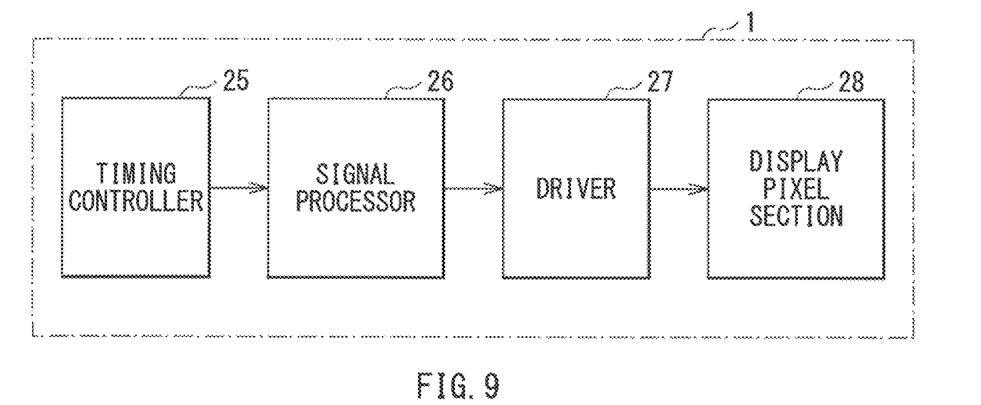
FIG. 9 is a block diagram illustrating an outline configuration of the display unit illustrated in FIG. 1.

FIG. 9 is a block diagram schematically illustrating an example outline configuration of the display unit 1. The display unit 1 may display, as an image, an external image signal or an internal image signal. The display unit 1 may be applied to, for example but not limited to, a liquid crystal display as well as the organic electroluminescent display described above. The display unit 1 may include, for example but not limited to, a timing controller 25, a signal processor 26, a driver 27, and a display pixel section 28.

The timing controller 25 may include a timing generator that generates various timing signals (control signals). The timing controller 25 may control driving of the signal processor 26 on the basis of the various timing signals.

For example, the signal processor 26 may perform a predetermined correction of an external digital image signal, and output the corrected image signal to the driver 27.

The driver 27 may include, for example but not limited to, a scanning-line driving circuit and a signal-line driving circuit, and may drive pixels in the display pixel section 28 via various control lines.

The display pixel section 28 may include, for example but not limited to, a display element (e.g., the display device layer 13 described above) and a pixel circuit that drives the display element on a pixel basis. The display element may be an organic electroluminescent element or a liquid crystal display element, for example.

[Example Configuration of Electronic Apparatus]

Figure 10:
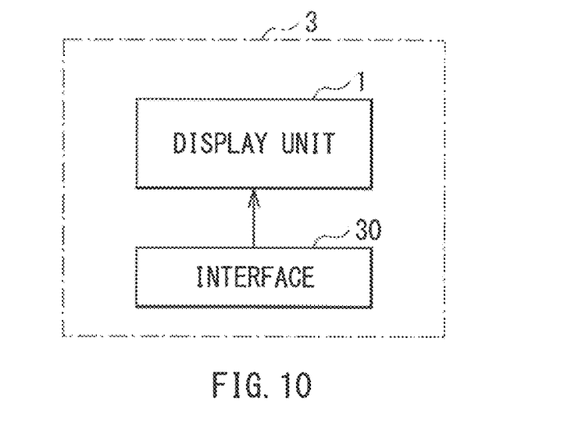
FIG. 10 is a block diagram illustrating an outline configuration of an electronic apparatus including the display unit illustrated in FIG. 9.

The display unit 1 described in any foregoing embodiment may be applied to a variety of electronic apparatuses. FIG. 10 is a block diagram of an example electronic apparatus 3 to which the display unit 1 illustrated in FIG. 9 is applied. Specific but non-limited examples of the electronic apparatus 3 may include television apparatuses, personal computers (PCs), smartphones, tablet PCs, mobile phones, digital still cameras, and digital video cameras, and other apparatuses having a displaying functionality.

The electronic apparatus 3 may include, for example but not limited to, the display unit 1 and an interface 30. The interface 30 may be an input section that receives various external signals and external electric power. Optionally, the interface 30 may include, for example, a user interface such as a touch panel, a keyboard, or operation buttons.

Although the technology is described hereinabove with reference to the example embodiments and modification examples, the technology is not limited thereto, but may be modified in a wide variety of ways.

For example, factors such as a material and a thickness of each layer exemplified in any foregoing embodiment and modification example are illustrative and non-limiting. Any other material and any other thickness may be adopted besides those described above. Additionally, the display unit does not necessarily include all of the layers described above, and may include another layer in addition to the layers described above.

In the example embodiments described above, the display device layer 13 may include the organic electroluminescent element; however, in an alternative embodiment of the technology, the display device layer 13 may include another display element, such as a liquid crystal display element.

Additionally, in the second embodiment described above, the shock-resistant structure may include the shock absorption layer 51, the second moisture barrier film 52, and the shock dispersion layer 53; however, in an alternative embodiment of the technology, the shock-resistant structure may include a plurality of shock absorption layers 51, a plurality of second moisture barrier films 52, or a plurality of shock dispersion layers 53.

It should be appreciated that the effects described herein are mere examples. Effects of an embodiment of the technology are not limited to those described herein. Any embodiment of the technology may further include any effect other than those described herein.

It is possible to achieve at least the following configurations from the above-described example embodiments of the technology.

(1) A display unit including:
a flexible substrate;
a display device layer provided on the flexible substrate;
a polarizer that is provided over the flexible substrate with the display device layer being interposed between the flexible substrate and the display device layer and has a first surface opposed to the flexible substrate, a second surface facing the first surface, and an end surface connecting the first surface and the second surface;
a first moisture barrier film covering the first surface of the polarizer; and
a second moisture barrier film that covers the second surface and the end surface of the polarizer, and is in contact with the first moisture barrier film.

(2) The display unit according to (1), further including a polarization plate,
the polarization plate including:
the polarizer;
a retardation layer provided between the polarizer and the display device layer; and
a protective film opposed to the retardation layer with the polarizer being interposed between the protective film and the retardation layer,
the polarization plate having an end surface that includes the end surface of the polarizer.

(3) The display unit according to (2), in which the second moisture barrier film covers the second surface of the polarizer with the protective film being interposed between the second moisture barrier film and the second surface of the polarizer, and covers the end surface of the polarization plate.

(4) The display unit according to (2), in which the second moisture barrier film is provided between the polarizer and the protective film.

(5) The display unit according to any one of (1) to (4), in which the second moisture barrier film has a moisture-vapor transmission rate of $1\times10^{-3}$ g/(m$^2$·day) or less.

(6) The display unit according to any one of (1) to (5), in which the second moisture barrier film opposed to the end surface of the polarization plate has a thickness in a range from 0.1 micrometres to 20 micrometres.

(7) The display unit according to any one of (1) to (6), in which the polarizer includes a polyvinyl alcohol-based film.

(8) The display unit according to (2), in which the first moisture barrier film is provided between the display device layer and the polarization plate.

(9) The display unit according to (8), in which the display device layer is sealed between the first moisture barrier film and the flexible substrate.

(10) The display unit according to (8) or (9), in which the first moisture barrier film has a moisture-vapor transmission rate of $1\times10^{-5}$ g/(m$^2$·day) or less.

(11) The display unit according to (1), in which the first moisture barrier film covers the first surface of the polarizer with the flexible substrate being interposed between the first moisture barrier film and the first surface of the polarizer.

(12) The display unit according to (11), further including a first adhesive layer provided between the flexible substrate and the first moisture barrier film.

(13) The display unit according to (3), further including a second adhesive layer provided between the polarization plate and the second moisture barrier film.

(14) The display unit according to any one of (1) to (13), in which the display device layer includes an organic layer.

(15) A display unit including:
a flexible substrate;
a display device layer provided on the flexible substrate;
a polarizer that is provided over the flexible substrate with the display device layer being interposed between the flexible substrate and the display device layer and has a first surface opposed to the flexible substrate, a second surface facing the first surface, and an end surface connecting the first surface and the second surface;
a first moisture barrier film covering the first surface of the polarizer;
a shock absorption layer that is in a gel-state and opposed to the display device layer with the polarizer being interposed between the shock absorption layer and the display device layer, and has a thickness of submillimeter order or greater;
a shock dispersion layer that is opposed to the display device layer with the shock absorption layer being interposed between the shock dispersion layer and the display device layer and has a pencil hardness of 3H or higher; and
a second moisture barrier film that is provided between the shock dispersion layer and the shock absorption layer, covers the second surface of the polarizer, and has a higher bending strength and a higher tensile strength than the shock dispersion layer.

(16) The display unit according to (15), in which the second moisture barrier film further covers the end surface of the polarizer.

(17) The display unit according to (15) or (16), further including a buffer layer opposed to the display device layer with the flexible substrate being interposed between the buffer layer and the display device layer.

The display unit according to (1) includes the first moisture barrier film and the second moisture barrier film. The polarizer is thus sealed between the first moisture barrier film and the second moisture barrier film.

The display unit according to (13) includes the first moisture barrier film and the second moisture barrier film. The polarizer is thus provided between the first moisture barrier film and the second moisture barrier film.

The display units according to (1) and (13) each include the first moisture barrier film and the second moisture barrier film. This makes it possible to suppress moisture infiltration from the exterior into the polarizer. Accordingly, it is possible to suppress moisture infiltration in to the polarizer.

Note that effects of the technology are not limited to those described above, and may be any effect described herein.

Although the technology is described hereinabove in terms of example embodiments and modification examples, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this technology, the use of the terms first, second, etc. do not denote any order or importance, but rather the terms first, second, etc. are used to distinguish one element from another. Note that the term "plate" as used herein may be used interchangeably with the term "sheet". The term "over" as used herein may be broadly interpreted as referring to covering all or a portion of an underlying surface. Further, other surfaces may also be covered. The term "over" may also encompass both cases where there are intervening layers between the layer and and an underlying surface and where the layer is provided directly on the underlying surface. Moreover, no element or component in this technology is intended to be dedicated to the public regardless of whether the element or component is explicitly recited in the following claims.

What is claimed is:

1. A display unit comprising:
   a flexible substrate;
   a display device layer on the flexible substrate;
   a polarization plate including
      a polarizer over the flexible substrate with the display device layer being interposed between the flexible substrate and the polarizer, and having a first surface opposed to the flexible substrate, a second surface facing the first surface, and an end surface connecting the first surface and the second surface,
      a retardation layer between the polarizer and the display device layer, and
      a protective film opposed to the retardation layer with the polarizer being interposed between the protective film and the retardation layer,
      the polarization plate having an end surface that includes the end surface of the polarizer;
   a first moisture barrier film covering the first surface of the polarizer;
   a second moisture barrier film covering the second surface and the end surface of the polarizer, and contacting the first moisture barrier film, wherein the second moisture barrier film covers the second surface of the polarizer with the protective film being interposed between the second moisture barrier film and the second surface of the polarizer, and covers the end surface of the polarization plate; and
   a second adhesive layer between the polarization plate and the second moisture barrier film.

2. The display unit according to claim 1, wherein the second moisture barrier film has a moisture-vapor transmission rate of $1 \times 10^{-3}$ g/(m$^2$·day) or less.

3. The display unit according to claim 1, wherein the second moisture barrier film opposed to the end surface of the polarization plate has a thickness in a range from 0.1 micrometres to 20 micrometres.

4. The display unit according to claim 1, wherein the polarizer comprises a polyvinyl alcohol-based film.

5. The display unit according to claim 1, wherein the first moisture barrier film is between the display device layer and the polarization plate.

6. The display unit according to claim 5, wherein the display device layer is sealed between the first moisture barrier film and the flexible substrate.

7. The display unit according to claim 5, wherein the first moisture barrier film has a moisture-vapor transmission rate of $1 \times 10^{-5}$ g/(m$^2$·day) or less.

8. The display unit according to claim 1, wherein the first moisture barrier film extends beyond an entirety of the first surface of the polarizer with the flexible substrate being interposed between the first moisture barrier film and the first surface of the polarizer.

9. The display unit according to claim 8, further comprising a first adhesive layer between the flexible substrate and the first moisture barrier film.

10. The display unit according to claim 1, wherein the display device layer includes an organic layer.

11. A display unit comprising:
    a flexible substrate;
    a display device layer provided on the flexible substrate;
    a polarizer that is provided over the flexible substrate with the display device layer being interposed between the flexible substrate and the polarizer and has a first surface opposed to the flexible substrate, a second surface facing the first surface, and an end surface connecting the first surface and the second surface;
    a first moisture barrier film covering the first surface of the polarizer;
    a shock absorption layer that is in a gel-state and opposed to the display device layer with the polarizer being interposed between the shock absorption layer and the display device layer and has a thickness of submillimeter order or greater;
    a shock dispersion layer that is opposed to the display device layer with the shock absorption layer being interposed between the shock dispersion layer and the display device layer, and has a pencil hardness of 3H or higher; and
    a second moisture barrier film that is provided between the shock dispersion layer and the shock absorption layer, covers the second surface of the polarizer, and has a higher bending strength and a higher tensile strength than the shock dispersion layer.

12. The display unit according to claim 11, wherein the second moisture barrier film further covers the end surface of the polarizer.

13. The display unit according to claim 11, further comprising a buffer layer opposed to the display device layer with the flexible substrate being interposed between the buffer layer and the display device layer.

* * * * *